US012700571B2

(12) United States Patent (10) Patent No.: US 12,700,571 B2

Guo et al. (45) Date of Patent: Aug. 4, 2026

(54) SOLID STATE VARIABLE CAPACITORS FOR RF MATCHES

(71) Applicant: Applied Materials, Inc., Santa Clara, CA (US)

(72) Inventors: Yue Guo, Redwood City, CA (US); A N M Wasekul Azad, Santa Clara, CA (US); Yang Yang, San Diego, CA (US); Kartik Ramaswamy, San Jose, CA (US); Nicolas J. Bright, Arlington, WA (US)

(73) Assignee: Applied Materials, Inc., Santa Clara, CA (US)

( * ) Notice: Subject to any disclaimer, the term of this patent is extended or adjusted under 35 U.S.C. 154(b) by 117 days.

(21) Appl. No.: 18/628,266

(22) Filed: Apr. 5, 2024

(65) Prior Publication Data

US 2025/0316453 A1    Oct. 9, 2025

(51) Int. Cl.
 *H01J 37/32* (2006.01)
 *H03H 7/40* (2006.01)

(52) U.S. Cl.
 CPC .. *H01J 37/32183* (2013.01); *H01J 37/32128* (2013.01); *H01J 37/32146* (2013.01); *H03H 7/40* (2013.01)

(58) Field of Classification Search
 None
 See application file for complete search history.

(56) References Cited

U.S. PATENT DOCUMENTS

| | | | |
|---|---|---|---|
| 2017/0345620 A1 | 11/2017 | Coumou et al. | |
| 2019/0326094 A1* | 10/2019 | Bhutta | H01L 21/31116 |
| 2020/0035461 A1* | 1/2020 | Bhutta | H01L 21/31116 |
| 2020/0083022 A1* | 3/2020 | Huang | H01L 21/31116 |
| 2020/0168439 A1* | 5/2020 | Bhutta | H03H 7/40 |
| 2020/0286720 A1 | 9/2020 | Van Greunen et al. | |
| 2020/0373128 A1* | 11/2020 | Ulrich | H01L 22/26 |
| 2021/0327684 A1* | 10/2021 | Bhutta | H01J 37/3299 |
| 2022/0199381 A1 | 6/2022 | Tian et al. | |

(Continued)

FOREIGN PATENT DOCUMENTS

| | | |
|---|---|---|
| JP | 2021108413 A | 7/2021 |
| KR | 20230087296 A | 6/2023 |
| WO | 2024129516 A1 | 6/2024 |

OTHER PUBLICATIONS

International Search Report from PCT/US2025/021899 dated Jul. 15, 2025.

*Primary Examiner* — Srinivas Sathiraju

(74) *Attorney, Agent, or Firm* — Patterson + Sheridan, LLP

(57) ABSTRACT

Embodiments of the present disclosure provide a system for fast impedance tuning. The system includes a radio frequency (RF) generator to generate power, a plasma chamber to receive the power from the RF generator and a RF matching network inserted between the RF generator and the plasma chamber configured to match a plasma load impedance to a RF generator impedance using a solid state based variable capacitor. The RF matching network includes a bias circuit that applies a reverse bias to the solid state based variable capacitor to control a capacitance value of the solid state based variable capacitor. The plasma load impedance is matched with the RF generator impedance when pulsed voltage, multi-level pulsing, or RF match ignition tuning is applied.

20 Claims, 5 Drawing Sheets

(56)         References Cited

U.S. PATENT DOCUMENTS

| | | | | |
|---|---|---|---|---|
| 2023/0215696 A1* | 7/2023 | Decker | ............ | H01L 21/67069 |
| | | | | 333/17.3 |
| 2023/0253183 A1* | 8/2023 | Mavretic | ............ | H10D 62/8503 |
| | | | | 333/32 |
| 2023/0411119 A1* | 12/2023 | Yu | ....................... | H01J 37/32926 |
| 2024/0079212 A1* | 3/2024 | Guo | .................. | H01J 37/32183 |
| 2024/0087859 A1* | 3/2024 | Ramaswamy | .... | H01J 37/32862 |
| 2024/0118328 A1* | 4/2024 | Guo | .................. | H01J 37/32935 |
| 2024/0145216 A1* | 5/2024 | Bhutta | .............. | H01J 37/32146 |
| 2024/0194447 A1* | 6/2024 | Guo | .................. | H01J 37/32091 |
| 2024/0194449 A1* | 6/2024 | Bhutta | .................... | C23C 16/52 |
| 2024/0234095 A1* | 7/2024 | Decker | .................... | H03H 7/40 |
| 2024/0235517 A1* | 7/2024 | Decker | ................. | H03K 17/08 |
| 2024/0371605 A1* | 11/2024 | Guo | .................. | H01J 37/32183 |
| 2024/0412947 A1* | 12/2024 | Guo | ................. | H01J 37/32146 |
| 2025/0046576 A1* | 2/2025 | Guo | ................. | H01J 37/32706 |
| 2025/0087462 A1* | 3/2025 | Guo | ................. | H01J 37/32935 |
| 2025/0140541 A1* | 5/2025 | Guo | ................. | H01J 37/32935 |
| 2025/0218748 A1* | 7/2025 | Guo | .................. | H01J 37/32183 |
| 2025/0233571 A1* | 7/2025 | Guo | ..................... | H03H 7/0115 |
| 2025/0239435 A1* | 7/2025 | Azad | ................. | H01J 37/32183 |
| 2025/0253130 A1* | 8/2025 | Guo | ................. | H01J 37/32146 |
| 2025/0316453 A1* | 10/2025 | Guo | ......................... | H03H 7/40 |

* cited by examiner

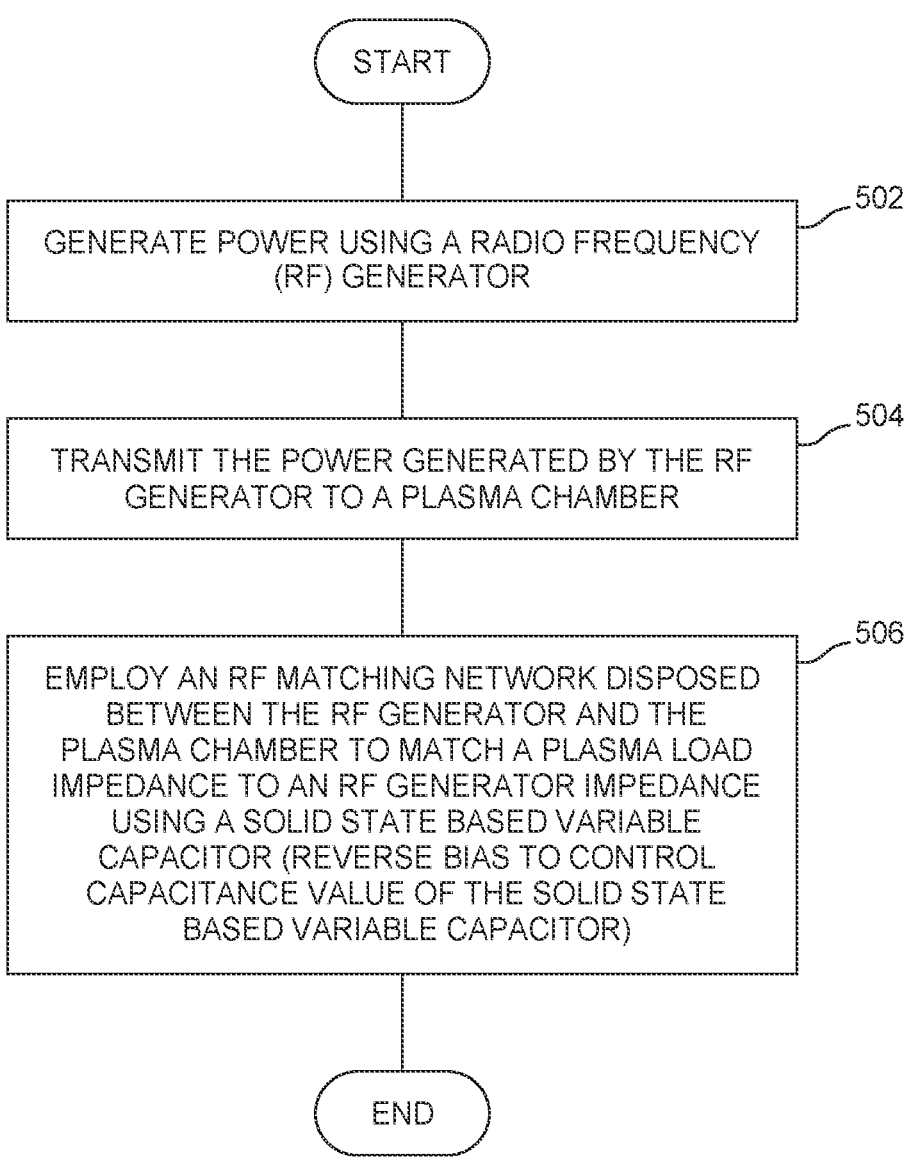

START

GENERATE POWER USING A RADIO FREQUENCY (RF) GENERATOR — 502

TRANSMIT THE POWER GENERATED BY THE RF GENERATOR TO A PLASMA CHAMBER — 504

EMPLOY AN RF MATCHING NETWORK DISPOSED BETWEEN THE RF GENERATOR AND THE PLASMA CHAMBER TO MATCH A PLASMA LOAD IMPEDANCE TO AN RF GENERATOR IMPEDANCE USING A SOLID STATE BASED VARIABLE CAPACITOR (REVERSE BIAS TO CONTROL CAPACITANCE VALUE OF THE SOLID STATE BASED VARIABLE CAPACITOR) — 506

END

FIG. 5

SOLID STATE VARIABLE CAPACITORS FOR RF MATCHES

BACKGROUND

Field

Embodiments described herein generally relate to radio frequency (RF) matching. More specifically, embodiments described herein relate to using a solid state based variable capacitor to achieve RF matching.

Description of the Related Art

Electronic theory states that maximum power is transferred from a source to a load when the source resistance matches the load resistance. With most radio frequency (RF) circuits, however, the source and load impedances have a reactive element, in which case the source impedance must be equal to the complex conjugate of the load impedance for maximum power transfer. In other words, while the real parts of the source and load impedance must match, the imaginary part of the load impedance must be opposite in sign to the imaginary part of the source impedance. Impedance matching involves the design of a circuit to be inserted between the source and the load for maximum power transfer. However, achieving impedance matching using a typical variable capacitor driven by a step motor can take too long.

Accordingly, what is needed in the art are improved circuits for achieving faster impedance matching.

SUMMARY

Embodiments of the present disclosure provide a system including a radio frequency (RF) generator to generate power, a plasma chamber to receive the power from the RF generator, and a RF matching network inserted between the RF generator and the plasma chamber configured to match a plasma load impedance to a RF generator impedance using a solid state based variable capacitor.

Embodiments of the present disclosure provide a RF matching network including a solid state based variable capacitor and a bias circuit that applies a reverse bias to the solid state based variable capacitor to control a capacitance value of the solid state based variable capacitor.

Embodiments of the present disclosure provide a method including generating power using a radio frequency (RF) generator, transmitting the power to a plasma chamber, and inserting a RF matching network between the RF generator and the plasma chamber configured to match a plasma load impedance to a RF generator impedance using a solid state based variable capacitor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5 is a method for implementing a RF matching circuit using a solid state based variable capacitor (diode array), according to one or more of the embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
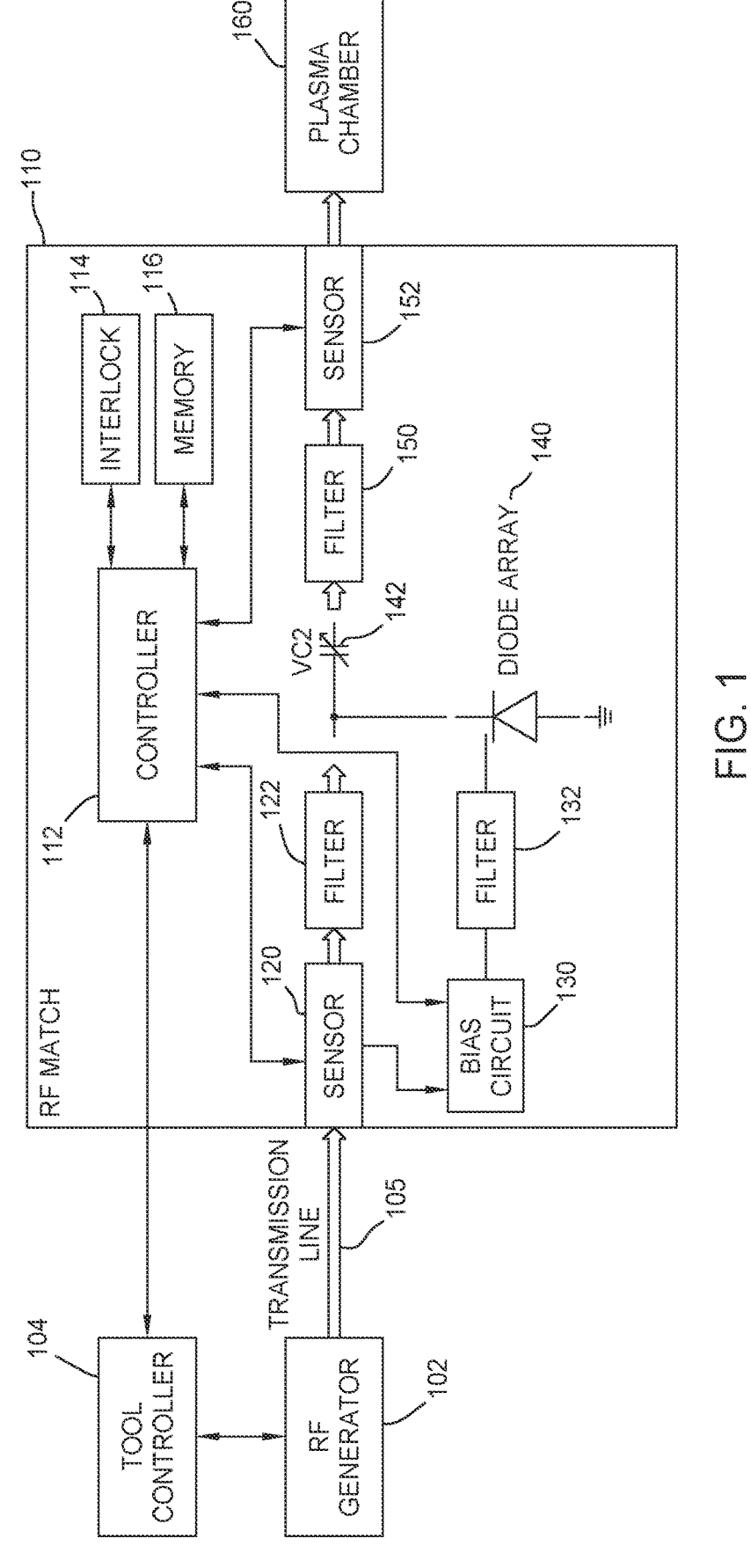
FIG. 1 is a schematic of an impedance circuit disposed between a radiofrequency (RF) generator and a plasma chamber, according to one or more of the embodiments described herein.

Embodiments of the present disclosure generally relate to impedance matching, and more particularly, to impedance matching in a semiconductor device fabrication process.

The semiconductor device fabrication process uses plasma processing at different stages to make semiconductor devices, which may include a microprocessor, a memory chip, and other types integrated circuits and devices. Plasma processing involves energizing a gas mixture by imparting energy to the gas molecules by introducing radio frequency (RF) energy into the gas mixture. This gas mixture is typically contained in a vacuum chamber, referred to as a plasma chamber, and the RF energy is typically introduced into the plasma chamber through electrodes.

In a typical plasma process, the RF generator generates power at a radio frequency, which is broadly understood as being within the range of 3 kHz and 300 GHz, and this power is transmitted through RF cables and networks to the plasma chamber. In order to provide efficient transfer of power from the RF generator to the plasma chamber, an intermediary circuit is used to match the fixed impedance of the RF generator with the variable impedance of the plasma chamber. Such an intermediary circuit is commonly referred to as a RF impedance matching network, or more simply as a RF matching network.

The purpose of the RF matching network is to transform the variable plasma impedance to a value that more closely matches the fixed impedance of the RF generator. In many cases, particularly in semiconductor fabrication processes, the system impedance of the RF generator is fixed at 50 Ohms, and RF power is transmitted through coaxial cables which also have a fixed impedance of 50 Ohms. Unlike the impedance of the RF generator and the coaxial cables, the impedance of the plasma, which is driven by the RF power, varies. In order to effectively transmit RF power from the RF generator and the coaxial cables to the plasma chamber, the impedance of the plasma chamber must be transformed to non-reactive 50 Ohms (i.e., 50+j0). Doing so will help maximize the amount of RF power transmitted into the plasma chamber.

The typical RF matching network includes variable capacitors and a control circuit with a microprocessor to control the capacitance values of the variable capacitors. The value and size of the variable capacitors within the RF matching network are determined by the power handling capability, frequency of operation, and impedance range of the plasma chamber. The predominant type of variable capacitor used in RF matching network applications is a vacuum variable capacitor (VVC). The VVC is driven by, e.g., one or more motors, such as step motors. However, the one or more motors may not operate fast enough to match the impedance between the plasma chamber and the RF generator. The one or more motors may operate in the millisecond range, so the maximum frequency is less than 1 kHz resulting in slow tuning between the impedances of the plasma chamber and the RF generator.

The VVC is an electromechanical device, having two concentric metallic rings that are moved in relation to each other to change capacitance. In complex semiconductor fabrication processes using plasma chambers, where the impedance changes are often frequent, the frequent adjustments needing to be made to a VVC leads to mechanical failures, often within less than a year of use for individual VVCs. Failure of a VVC leads to downtime for fabrication equipment so that the failed VVC can be replaced. Due to a desire to eliminate points of mechanical failure in the semiconductor fabrication process, it is unsurprising that the VVCs in RF matching networks are one of the last electro-mechanical components that remain in wide use in the semiconductor fabrication process.

As semiconductor devices shrink in size and become more complex, the feature geometries become very small. As a result, the processing time for each individual step needed to fabricate these small features has likewise been reduced, typically in the range of 5~6 s. RF matching networks which use VVCs generally take in the range of 1~2 s to match the plasma chamber impedance to the RF generator impedance.

During a significant amount of the matching process, which includes the microprocessor determining the capacitances for the VVCs needed to create the match, controlling the VVCs to the achieve the determined capacitances, and then finally time for the RF matching network circuits to stabilize with the new capacitances, the fabrication process parameters are unstable, and these unstable process parameters must be accounted for as part of the overall fabrication process. Because the matching process time is becoming a more and more significant part of the time for each fabrication process step, new circuit designs are desired to achieve even faster impedance matching in the semiconductor device fabrication process. Moreover, in a conventional RF match, a vacuum variable capacitor cannot move fast enough to follow impedance changes within one pulsed voltage technology (PVT) or multi-level pulsing cycle. The RF match can only perfectly tune to one selected impedance, and higher reflected power occurs due to mismatch at the other impedance states of the PVT. Also, frequency tuning can only fast tune the imaginary part, but not the real part.

The example embodiments present a RF matching network with a solid state based variable capacitor for ultra-fast impedance tuning. The solid state variable capacitor of the example embodiments is not driven by motors or step motors. Instead, a diode array is implemented that provides a high VI rating and can adjust a capacitance range. In the example embodiments, by using a diode array (a solid state based variable capacitor) not driven by step motors, the impedance matching between the plasma load impedance and the RF generator impedance can be performed in the millisecond range, thus resulting in 1000× time faster impedance matching.

The proposed RF matching network can match impedance changes when PVT is on and off, and within a multi-level pulsing cycle. This advantageously leads to lower reflected power, better power delivery efficiency, faster etch rate, and better on-wafer results. In one example, the RF matching network employs a solid state based variable capacitor to achieve ultra-fast impedance tuning. The tuning is "analog" tuning achieved by continuously changing of the capacitance value, and not "digital" tuning like a switch. This helps to reduce reflected power in applications such as with PVT on and off, RF multi-level pulsing, and RF match ignition tuning. In one example, the solid state based variable capacitor includes a diode array. In another example, the solid state based variable capacitor may include multiple diode arrays. In some other embodiments, the solid state based variable capacitor may also include a vacuum capacitor.

FIG. 1 is a schematic of an impedance circuit disposed between a RF generator and a plasma chamber, according to one or more of the embodiments described herein.

The system 100 shows a RF generator 102, which can be referred to as a source that provides power to the plasma chamber 160, which can be referred to as a load. A RF matching network 110 is placed between the RF generator 102 and the plasma chamber 160. The RF generator 102 transmits power via a transmission line 105. The RF generator 102 is also in communication with a tool controller 104.

The RF matching network 110 includes a controller 112 communicating with an interlock 114 and a memory 116. The controller 112 communicates with a sensor 120 coupled to a filter 122. The sensor 120 may be used to detect RF voltages. The sensor 120 also aids in feedback control. The sensor 120 communicates with a bias circuit 130 coupled to a bias circuit filter 132. The bias circuit 130 provides feedback control of the bias voltages. The bias voltages will set the AC and DC operating points for transistor operation. The bias circuit filter 132 further electrically protects the bias circuit 130.

Figure 2:
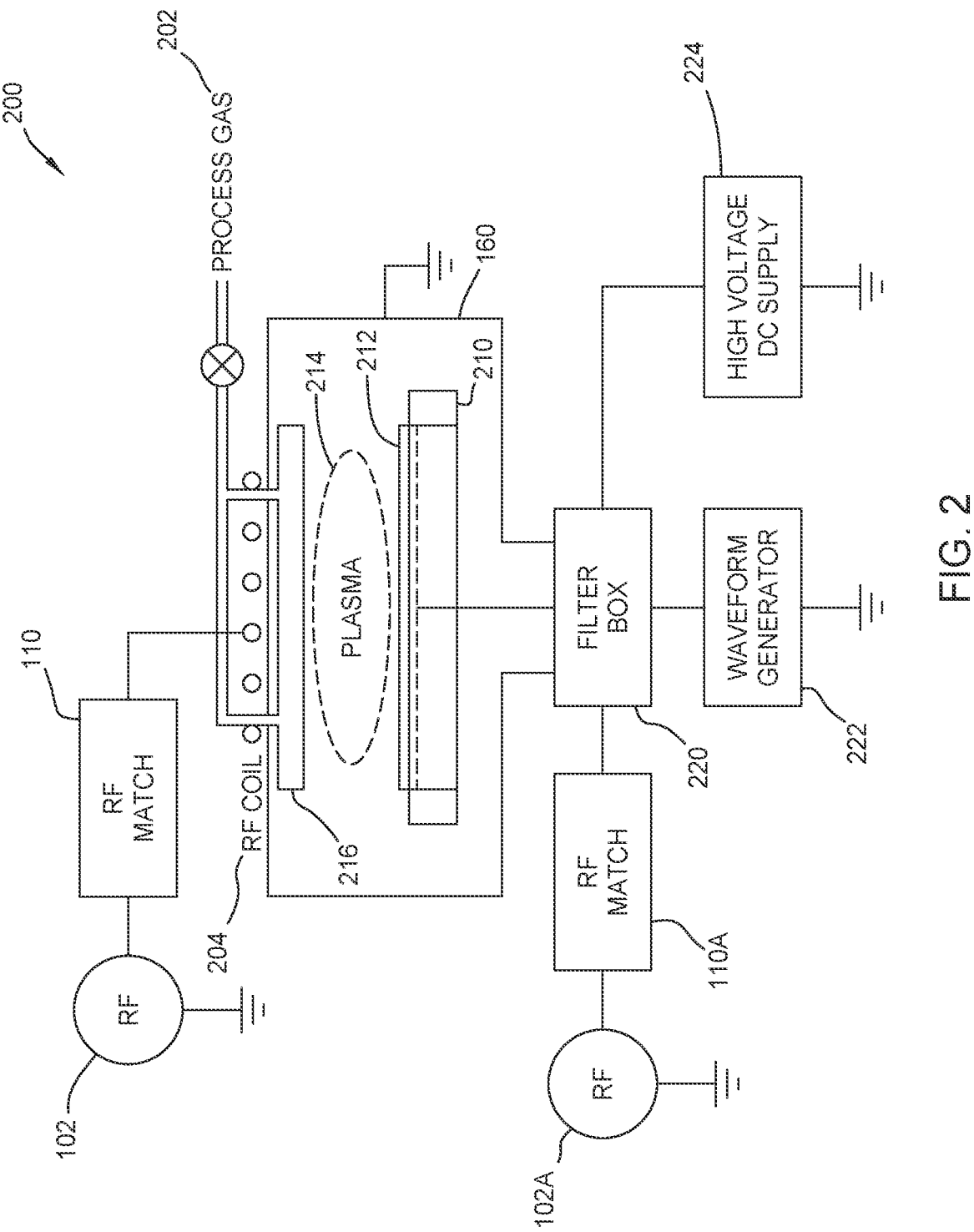
FIG. 2 is a schematic of a first application where pulsed voltage (PV) is turned on and off, according to one or more of the embodiments described herein.

The bias circuit 130 performs feedback control. The bias circuit 130 can be coupled to the controller 112, which can control the reverse bias voltage applied to the diode array 140. Moreover, for the bias circuit 130 to output a proper rate of voltage, the output of the bias circuit 130 should be synchronized with output of the RF generator 102. Therefore, a trigger signal can be generated to trigger the bias circuit 130 to output an appropriate reverse bias voltages to be supplied to the diode array 140 (i.e., solid state based variable capacitor. The voltage from the bias circuit 130 is thus synchronized with the different type of voltages output from the waveform generator 222 (FIG. 2) whether using PVT technology (first application) or using multi-level pulsing (second application) or using RF match ignition tuning (third application). Therefore, the bias circuit 130 needs to be synchronized with either the RF generator 102 of with the waveform generator 222 (FIG. 2).

The RF matching network 110 further includes the diode array 140 and a variable vacuum capacitor 142. The diode array 140 can be referred to as a solid state based variable capacitor. In one example, the solid state based variable capacitor includes multiple diode arrays. The variable vacuum capacitor 142 is driven by a step motor. However, the solid state based variable capacitor (i.e., the diode array 140) is not driven by a step motor. Instead, the solid state based variable capacitor is driven by the bias voltage supplied by the bias circuit 130.

Figure 6:
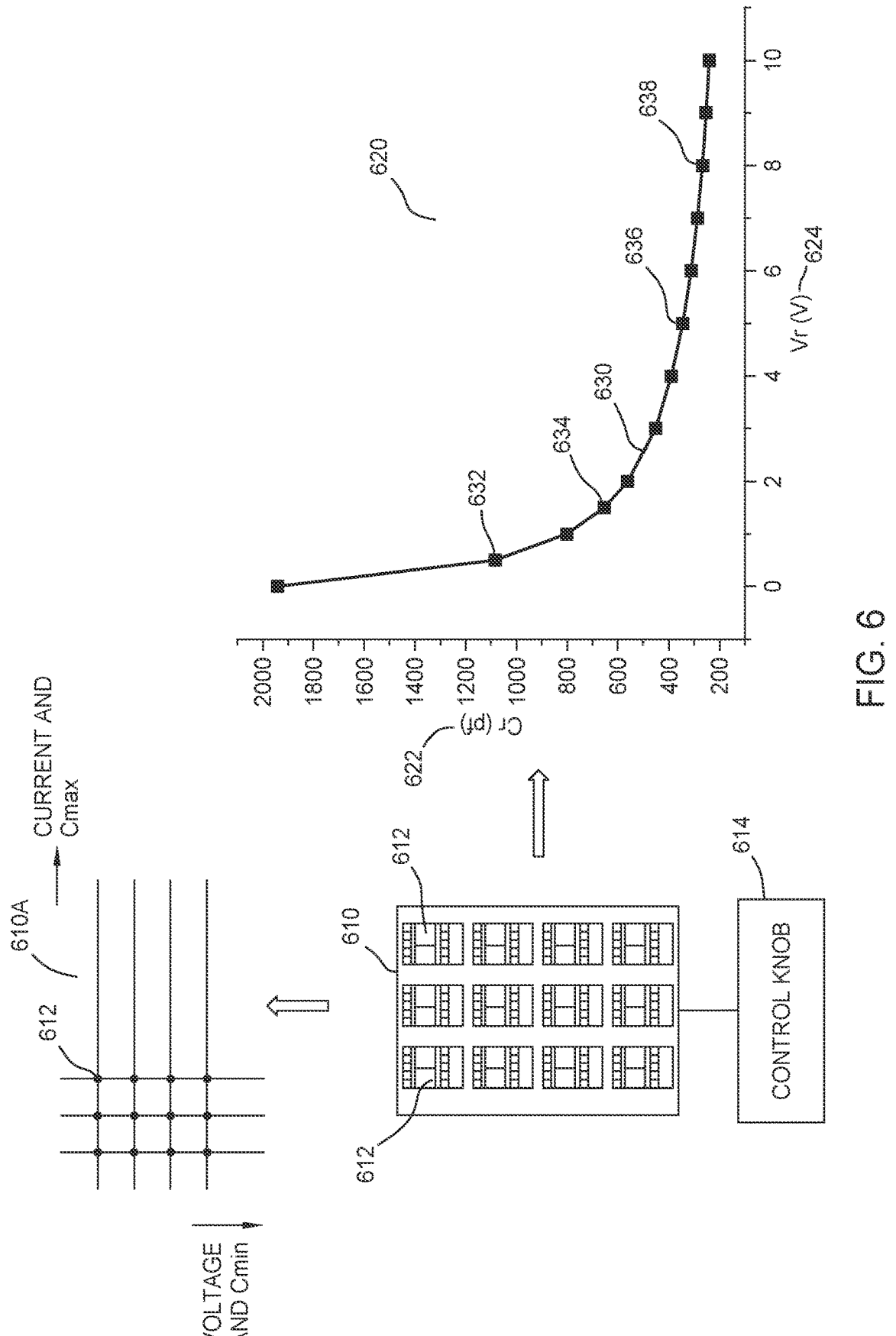
FIG. 6 is a graph illustrating analog tuning by continuously changing a capacitance value of a solid state based variable capacitor, according to one or more of the embodiments described herein.

In one example, the diode array 140 includes a plurality of diodes. The plurality of diodes can be, e.g., Schottky diodes. Thus, the diode array 140 can include a plurality of Schottky diodes. The diode array 140 is connected at one end to ground. The voltage at the other end of the diode array 140 is controlled. By controlling the voltage at the top end of the diode array 140, different capacitance values can be obtained as shown in FIG. 6 described below. In other words, voltage is measured at one end of the diode array 140 and then an appropriate bias voltage (or reverse bias voltage) is provided by the bias circuit 130 to drive the diode array 140 (i.e., the solid state based variable capacitor). By controlling the voltage at the top end of the diode array 140, a user can also control the change in capacitance values. In other words, the user can select specific capacitance values by controlling the bias voltage provided by the bias circuit 130.

In one example, the diode array 140 can include a plurality of Schottky diodes. The Schottky diode is a semiconductor diode formed by the junction of a semiconductor with a metal. The Schottky diode has a low forward voltage drop and a very fast switching action. When sufficient forward voltage is applied, a current flows in the forward direction. A silicon p-n diode has a typical forward voltage of 600-700 mV, while the Schottky's forward voltage is 150-450 mV. This lower forward voltage requirement allows higher switching speeds and better system efficiency.

The Schottky diode has a metal-semiconductor junction formed between a metal and a semiconductor, creating a Schottky barrier. The metal side acts as the anode, and n-type semiconductor acts as the cathode of the diode. As such, conventional current can flow from the metal side to the semiconductor side, but not in the opposite direction. This Schottky barrier results in both very fast switching and low forward voltage drop.

The choice of the combination of the metal and semiconductor determines the forward voltage of the diode. Both n- and p-type semiconductors can develop Schottky barriers. However, the p-type typically has a much lower forward voltage.

Diodes are components that normally only let current flow in one direction. Like a regular diode, the Schottky diode allows current to flow in the forward direction when enough forward voltage is applied. The Schottky diode has a relatively small voltage drop, usually between 0.15 to 0.45 V. This low forward voltage enables it to switch on and off much faster than traditional PN junction diodes.

Therefore, the RF matching network 110 can use, in one non-limiting example, Schottky diodes for impedance matching to provide for faster switching operation. The use of Schottky diodes thus can provide for ultra-fast impedance tuning. Conventional impedance matching between a plasma load impedance and a RF generator impedance can be in the range of 1-2 seconds. However, with the use of a diode array (i.e., solid state based variable capacitor), such impedance matching between the plasma load impedance and the RF generator impedance can advantageously be performed in the millisecond range or below. The array of Schottky diodes advantageously matches impedance changes quickly when the PVT is on and off, and when a multi-level pulsing cycle is present. The array of diodes (i.e., solid state based variable capacitor) advantageously lowers the reflected power, provides better power delivery efficiency, a faster etch rate, and better on-wafer results.

In other embodiments, a PIN diode can also be used instead of a Schottky diode. A PIN diode operates under what is known as high-level injection. In other words, the intrinsic "i" region is flooded with charge carriers from the "p" and "n" regions. Its function can be likened to filling up a water bucket with a hole on the side. Once the water reaches the hole's level it will begin to pour out. Similarly, the diode will conduct current once the flooded electrons and holes reach an equilibrium point, where the number of electrons is equal to the number of holes in the intrinsic region. When the diode is forward biased, the injected carrier concentration is typically several orders of magnitude higher than the intrinsic carrier concentration. Due to this high level injection, which in turn is due to the depletion process, the electric field extends deeply (almost the entire length) into the region. This electric field helps in speeding up of the transport of charge carriers from the P to the N region, which results in faster operation of the diode. As such, in other embodiments, such PIN diodes can also be used to construct the diode array 140 (i.e., solid state based variable capacitor) to achieve faster impedance tuning between the RF generator 102 and the plasma chamber 160.

The output of the diode array 140 is provided to a filter 150 and a sensor 152. The sensor 152 can be, e.g., an output sensor. The output of the sensor 152 is coupled to the plasma chamber 160. The sensor 152 is used to measure a plasma load impedance. In certain cases, the sensor 152 is optional. The filter 150 aids in filtering out frequencies of the plasma chamber 160. In the first application, when PVT technology is employed, many harmonics are present. If the fundamental frequency is, e.g., 400 kHz, then the frequency domain will have several high frequency harmonics. The filter 150 will filter out such harmonic frequencies to allow only one domain frequency part. In other words, if a 13 MHz generator is used, such frequency needs to be passed to the plasma chamber 160, and all other frequencies need to be blocked or filtered out. As such, only the 13 MHz frequency is passed through to the plasma chamber 160.

The plasma chamber 160 can also be referred to as a vacuum chamber, which holds the process gas in low pressure. The plasma chamber 160 is designed as a pressure reservoir. The plasma chamber 160 is made of a material not susceptible to etching from the process gases used, often stainless steel.

FIG. 2 is a schematic of a first application where pulsed voltage (PV) is turned on and off, according to one or more of the embodiments described herein.

The system 200 includes the RF generator 102 communicating with the plasma chamber 160 via the RF matching network 110 including the variable vacuum capacitor 142 and the diode array 140 having a plurality of diodes. The plurality of diodes can be, e.g., Schottky diodes. The diode array 140 is referred to as a solid state based variable capacitor. In some examples, the solid state based variable capacitor includes multiple diode arrays. The variable vacuum capacitor 142 is driven by a step motor. The diode array 140 is not driven by a step motor. Instead, the bias circuit 130 applies a reverse bias voltage to the solid state based variable capacitor (i.e., the diode array 140) to control a capacitance value of the solid state based variable capacitor (i.e., the diode array 140).

The plasma chamber 160 is fed with a process gas 202 through a RF coil 204 to apply a RF field to the process gas 202. The RF coil 204 provides the process gas 202 through a showerhead 216 to a substrate 212 resting on a substrate holder 210. Plasma 214 is created over the substrate 212 and within the plasma chamber 160.

The plasma 214 is matter that exists in the form of ions and electrons. Basically, it is the process gas 202 that's been electrically charged with freely moving electrons in both the negative and positive state. The situation is actually a resultant of further energy being given to the process gas 202, which causes the breaking free of negatively charged electrons from the nucleus. On a deeper level, the plasma 214 can be described as a gas that's been partially ionized. The plasma 214 is a mixture of neutral atoms, atomic ions, electrons, molecular ions, and molecules present in excited and ground states. The charges (positive and negative) balance each other. The charged particles present in plasma 214 are responsible for its high electrical conductivity. Since the plasma 214 consists of electrons, molecules or neutral gas atoms, positive ions, ultraviolet (UV) light along with excited gas molecules and atoms, it carries a good amount of internal energy. When all these molecules, ions and atoms come together and interact with a particular surface, plasma treatment is initiated on the substrate 212.

The plasma treatment is usually performed in a chamber or enclosure that's evacuated, such as the plasma chamber 160. The air within the plasma chamber 160 or enclosure is pumped out prior to letting the process gas 202 therein. The process gas 202 then flows in the enclosure at a low pressure. This is done before any energy (electrical power) is applied.

The plasma chamber 160 is coupled to a filter box 220. Another RF generator 102A can be coupled to another RF matching network 110A, which in turn is coupled to the filter box 220. A waveform generator 222 and a high-voltage DC supply 224 are also coupled to the filter box. The waveform generator 222 can be compatible with PVT technology (first application) or with multi-level pulsing (second application) or with RF match ignition tuning (third application). The filter box 220 can block RF signals travelling from the RF generator 102A to the waveform generator 222.

It is noted that the RF matching network 110A may not necessarily be the same as the RF matching network 110. In other words, the RF matching network 110A may or may not include a diode array.

The waveform generator 222 provides pulsed voltage (PV) to the to the diode array 140 (FIG. 1). Even though the PV is a square wave with alternating highs and lows (1s and 0s), the diode array 140 (i.e., solid state based variable capacitor) processes the voltage in an analog manner. The diode array 140 enables the user to control the capacitance values. For example, by controlling the voltage at the top end of the diode array 140, different capacitance values can be obtained (FIG. 6). In other words, voltage is measured at one end of the diode array 140 and then an appropriate bias voltage (or reverse bias voltage) is provided by the bias circuit 130 to drive the diode array 140 (i.e., to drive the solid state based variable capacitor). By controlling the voltage at the top end of the diode array 140, the user can also control the change in capacitance values even when a PV is applied.

Figures 3, 4:
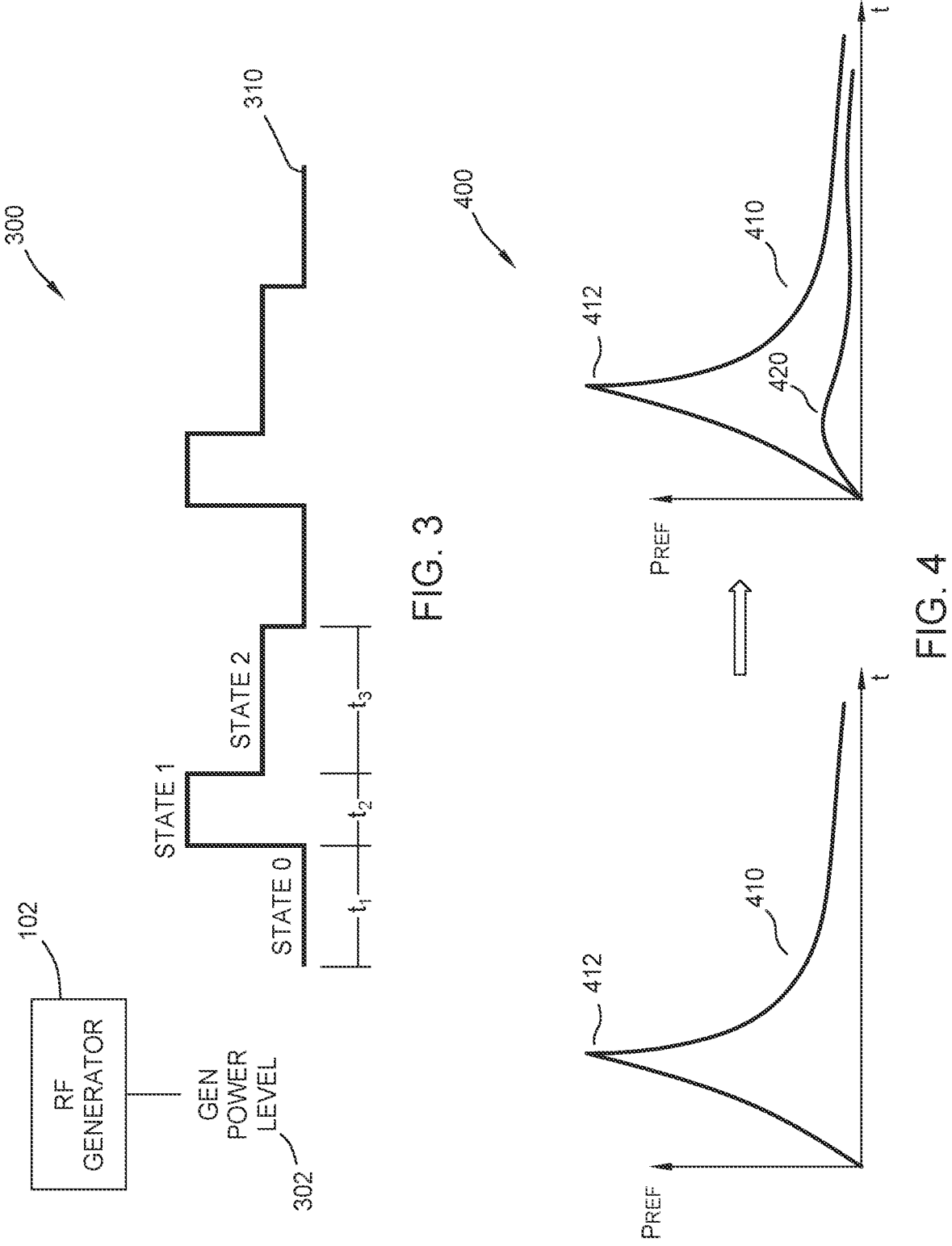
FIG. 3 is a schematic of a second application where RF multi-level pulsing is employed, according to one or more of the embodiments described herein.
FIG. 4 is a schematic of a third application where RF match ignition tuning is implemented, according to one or more of the embodiments described herein.

FIG. 3 is a schematic 300 of a second application where RF multi-level pulsing is employed, according to one or more of the embodiments described herein.

The array of diodes (i.e., solid state based variable capacitor) advantageously matches impedance changes quickly when the PVT is on and off (FIG. 2), and when a multi-level pulsing cycle is present (FIG. 3). Pulsating DC voltage is a type of electrical voltage that varies in magnitude over time, but always maintains a unidirectional flow of current. This type of voltage is characterized by its periodic fluctuations in amplitude, which can occur at a variety of frequencies. This type of voltage is obtained by continually charging and discharging the capacitor to create a pulsating effect.

The schematic 300 shows a waveform, such as a multi-level pulsing waveform or digital pulse signal 310 generated by the RF generator 102 to generate different power levels 302. This results in various pulsed states, such as State 0, State 1, State 2, etc. Each state has a different logic level. The multi-level pulsing can be, e.g., 3 levels. In this case, the three levels are high (State 1), low (State 2), and zero (State 3). The typical frequency of the multi-level pulsing ranges from 1 kHz to 10 kHz. However, in the example embodiments, by employing a diode array (or a solid state based variable capacitor) with a reverse bias voltage to drive the capacitance, instead of using step motors to drive capacitance, the frequency of the multi-level pulsing ranges from 0.1 kHz to 30 kHz. As such, the period of the three levels can be, e.g., 0.1 millisecond or 1 millisecond. Each period can thus have three states, where each state has its own impedance. The first state (State 1) has a first impedance, the second state (State 2) has a second impedance, and the third state (State 3) has a third impedance. Thus, three impedances can be accommodated within a period of, e.g., 1 millisecond.

In a first time period, $t_1$, the State 0 has a first logic level, e.g., 0. In a second time period, $t_2$, the State 1 has a second logic level, e.g., 2. In a third time period, $t_3$, the State 2 has a third logic level, e.g., 1. The multi-level pulsing is generated by the RF generator 102, which generates different power levels 302. The schematic 300 plots a logic level of a digital pulse signal 310 versus time. The states of the digital pulse signal 310 can repeat periodically after the end of time period $t_3$. A duty cycle of the digital pulse signal 310 during the States 0, 1, 2 is a positive real number less than 100.

In the example embodiments, even when a digital pulse signal 310 is generated by the RF generator 102, the array of diodes (i.e., solid state based variable capacitor) advantageously matches impedance changes quickly.

FIG. 4 is a schematic 400 of a third application where RF match ignition tuning is employed, according to one or more of the embodiments described herein.

The schematic 400 depicts a change in reflected power when a RF match ignition tuning is employed. The x-axis represents time (t) and the y-axis represents reflected power (PREF). The schematic 400 shows a waveform 410 with an initial spike 412, which then tapers off. In operation, when the plasma is ignited, it has an initial impedance. After ignition, the plasma is slowly reduced, which results in a different impedance. Thus, the impedance changes after a period of time of plasma ignition. Stated differently, after the spike representing reflected power is detected, the impedance is tuned so that the plasma load impedance is matched with the impedance of the RF generator. This results in the reflected power slowly dropping. Typically, when plasma processing takes place within the plasma chamber 160, during ignition, an initial high spike in the reflected power is observed. This results in an increased time for matching the plasma load impedance to the RF generator impedance. For example, the impedance matching is about 1-2 seconds.

The example embodiments replace a step motor with a diode array 140 (solid state based variable capacitor) to enable faster impedance matching. By employing the diode array 140, the initial spike 412 representing reflected power during plasma ignition is mitigated. The waveform 420 indicates the change in reflected power during plasma ignition when the diode array 140 is employed. The waveform 420 does not include the initial spike 412. Instead, the waveform 420 shows a small, smooth initial increase, which tapers off quickly. This results in a faster impedance matching between the impedance of the plasma load and the RF generator. The faster impedance is in the millisecond range, which is about 1000× times faster than the impedance match of typical systems using step motors.

In the example embodiments, even when a waveform 410 with the initial spike 412 is generated by the RF generator 102, the array of diodes (i.e., solid state based variable capacitor) advantageously matches impedance changes quickly, that is, much less than 1 sec.

FIG. 5 is a method for implementing a RF matching circuit using a solid state based variable capacitor (diode array), according to one or more of the embodiments described herein.

In block 502, a radio frequency (RF) generator is used to generate power.

In block 504, the power generated by the RF generator is transmitted to a plasma chamber.

In block 506, a RF matching network is disposed between the RF generator and the plasma chamber configured to match a plasma load impedance with a RF generator impedance using the diode array 140. A reverse bias is generated by the bias circuit 130 to control the capacitance value of the solid state based variable capacitor (i.e., the diode array 140).

FIG. 6 is a graph 620 illustrating analog tuning by continuously changing a capacitance value of a solid state based variable capacitor, according to one or more of the embodiments described herein.

The plasma load impedance can be matched with the RF generator impedance when the PVT is on or off (first application). The PVT is not changed from on to off via a switch. Instead, the variable vacuum capacitor 142 is used with, e.g., a control knob 614 to adjust the voltage or bias voltage of the diode array with variable capacitor circuit 610. As shown, the voltage 624 can be changed by the control knob 614 to control or adjust the capacitance 622 to a desired value. The capacitance 622 can be referred to as a junction capacitance. The voltage 624 can be referred to as a reverse voltage. The reverse voltage of the diode is the voltage when the positive end of the source is connected to the cathode and the negative end is connected to the anode. In other examples, the control knob 614 can adjust the solid state based variable capacitor, which may only include multiple diode arrays.

Further, the tuning of the solid state based variable capacitor can be referred to as analog tuning as the relationship between the capacitance 622 and the voltage 624 is a continuous line or waveform 625. The voltage 624 can be selected from any point along the waveform 625. The voltage 624 changes with a reverse bias applied by the bias circuit 130. In contrast, a digital tuner would behave like a switch, with a discrete signal consisting of 0s and 1s. Thus, the diode array with variable capacitor circuit 610 is not run like a digital switch, but rather like an analog device. A step motor does not drive capacitance change. Instead, the diode array with variable capacitor circuit 610 including the plurality of diodes 612 is used to change the capacitance with the aid of the variable vacuum capacitor 142. The user can employ the control knob 614 to fine-tune the capacitance value along the capacitance waveform 630. For example, capacitance values 632, 634, 636, 638 can be selected from the capacitance waveform 630. The capacitance waveform 630 is generated from the bias circuit 130 (FIG. 1) by applying a reverse bias to the diode array 140 (i.e., solid state based variable capacitor). As such, bias voltage applied to the diode array 140 is used to drive the capacitance value changes. In other example embodiments, the bias voltage is applied to the solid state based variable capacitor, which may include multiple diode arrays.

The voltage or reverse bias voltage applied by the bias circuit 130 is much faster than the voltage applied by a step motor. Thus, a faster impedance match can result between the plasma load impedance and the RF generator impedance by supplying reverse bias voltage to the diode array instead of using a step motor. In a typical configuration using a step motor to supply voltage, the impedance match can take about 1-2 seconds. In the present configuration, by using a diode array, the impedance match can be performed in the microsecond range. As such, the impedance matching between the plasma load and the RF generator can be 1000× times faster than typical systems.

For example, in a typical system, an algorithm is stored in the controller 112 (FIG. 1). If an impedance mismatch is detected between the RF generator and the plasma chamber, the power is not reflected back to the RF generator and this mismatch is detected by the sensor adjacent the RF generator. The sensor triggers the feedback control loop and sends the reflect power signal to the controller 112. The controller 112 drives two motors forming an L-network. The two motors can be step motors. As such, two capacitors are present, a shunt capacitor and a series capacitor. The RF signal drives the two step motors, which in turn results in the shunt capacitor and the series capacitor to both change. To detect the reflected power, the step motors may take 20 to 30 steps to complete the feedback control loop. Thus, it would take 20 to 30 steps or 20 to 30 control loops to complete the impedance tuning between the RF generator and the plasma chamber. That could take about 1-2 seconds. In contrast, in the example embodiments, by replacing the step motors with a diode array (i.e., solid state based variable capacitor), the impedance matching between the plasma load and the RF generator can be performed in the millisecond range, thus resulting in 1000× time faster impedance matching.

Referring back to FIG. 6, each node in the plot 610A represents a diode. In this example, there could be a 4×3 matrix, with 3 diodes along an x-axis and 4 diodes along a y-axis.

In the vertical direction, the more diodes that are present results in achieving a smaller minimum capacitance ($C_{min}$). Each time a capacitor is added, each capacitor handles less voltage so that the capacitor also has a bigger voltage rating and an increased capacitor range. For example, if there is 1 vertical line, then the maximum capacitance may be 70. However, if there are two vertical lines (or columns), the maximum capacitance maybe 140. If a third vertical line is added, then the maximum capacitance will be 3× times the original number of, e.g., 70.

In the horizontal direction, the capacitors can handle more current because each horizontal line can have the same current. As more current can be handled, the $C_{max}$ is also larger.

Therefore, the number of diodes in the vertical direction affects $C_{min}$ and the number of diodes in the horizontal directions affects $C_{max}$. Ideally, the diode array should be as large as possible (plot 601A as large as possible) to achieve a better VI rating and also achieve a larger capacitance range.

In summary, maximum power is transferred when the source impedance matches the load impedance. When source resistance equals load resistance, maximum power is transferred. If there is a reactive component in the source impedance, then the load impedance should be a complex conjugate of the source impedance for maximum power transfer. That means the source and load resistances match up and the imaginary reactive part of the load impedance will be negative of the imaginary reactive part of the source impedance. Impedance matching is significant in RF circuit design. Impedance matching involves the design of a circuit to be inserted between the source and load to achieve maximum power transfer. The example embodiments present a RF matching network with a diode array (referred to as a solid state based variable capacitor) and a vacuum capacitor for ultra-fast impedance tuning. In the example embodiments, by replacing the step motors with a diode array (or multiple diode arrays), the impedance matching between the plasma load generator and the RF generator can be performed in the millisecond range, thus resulting in 1000× time faster impedance matching. The proposed RF matching network can match impedance changes when PVT is on and off, and within a multi-level pulsing cycle. This advantageously leads to lower reflected power, better power delivery efficiency, faster etch rate, and better on-wafer results. The RF matching network achieves faster impedance matching by employing a solid state variable capacitor using reverse biased diodes to achieve ultra-fast impedance tuning. The tuning is "analog" tuning achieved by continuously changing of the capacitance value, and not "digital" tuning like a switch. This helps to reduce reflected power in applications such as with PVT on and off, RF multi-level pulsing, and RF match ignition tuning.

While the foregoing is directed to embodiments of the present disclosure, other and further embodiments of the disclosure may be devised without departing from the basic scope thereof, and the scope thereof is determined by the claims that follow.

What is claimed is:

1. A system comprising:
a radio frequency (RF) generator to generate power;
a plasma chamber to receive the power from the RF generator; and
a RF matching network disposed between the RF generator and the plasma chamber configured to match a plasma load impedance to a RF generator impedance using a solid state based variable capacitor comprising a diode array, wherein a capacitance of the solid state based variable capacitor is continuously varied by application of a reverse bias voltage.

2. The system of claim 1, wherein the solid state based variable capacitor includes a plurality of Schottky diodes.

3. The system of claim 1, wherein the solid state based variable capacitor includes a plurality of PIN diodes.

4. The system of claim 1, wherein a bias circuit is configured to apply the reverse bias voltage to the solid state based variable capacitor to control a capacitance value of the solid state based variable capacitor.

5. The system of claim 1, wherein the RF matching network includes a first sensor to detect RF voltages.

6. The system of claim 5, wherein the first sensor provides the RF voltages to a bias circuit.

7. The system of claim 1, wherein the RF matching network has a response time for matching the plasma load impedance to the RF generator impedance in a millisecond range.

8. The system of claim 1, wherein the RF matching network is configured to match the plasma load impedance to the RF generator impedance based on a pulsed voltage being applied.

9. The system of claim 1, wherein the RF matching network is configured to match the plasma load impedance to the RF generator impedance based on a multi-level pulsing being applied.

10. The system of claim 1, wherein the RF matching network is configured to match the plasma load impedance to the RF generator impedance based on RF match ignition tuning.

11. A radio frequency (RF) matching network comprising:
a solid state based variable capacitor comprising a diode array, wherein a capacitance of the solid state based variable capacitor is continuously varied by application of a reverse bias voltage; and
a bias circuit configured to apply the reverse bias to the solid state based variable capacitor to control a capacitance value of the solid state based variable capacitor.

12. The RF matching network of claim 11, wherein the RF matching network is disposed between a RF generator and a plasma chamber.

13. The RF matching network of claim 12, wherein the RF matching network is configured to match a plasma load impedance to a RF generator impedance.

14. The RF matching network of claim 13, wherein the RF matching network is configured to match the plasma load impedance to the RF generator impedance based on a pulsed voltage being applied.

15. The RF matching network of claim 13, wherein the RF matching network is configured to match the plasma load impedance to the RF generator impedance based on a multi-level pulsing being applied.

16. The RF matching network of claim 13, wherein the RF matching network is configured to match the plasma load impedance to the RF generator impedance based on RF match ignition tuning.

17. The RF matching network of claim 11, wherein the RF matching network includes a first sensor to detect RF voltages.

18. The RF matching network of claim 17, wherein the first sensor provides the RF voltages to the bias circuit.

19. A method comprising:
generating power using a radio frequency (RF) generator;
transmitting the power to a plasma chamber; and
inserting a RF matching network between the RF generator and the plasma chamber configured to match a plasma load impedance to a RF generator impedance using a solid state based variable capacitor comprising a diode array, wherein a capacitance of the solid state based variable capacitor is continuously varied by application of a reverse bias voltage.

20. The method of claim 19, wherein the RF matching network includes a bias circuit that applies the reverse bias to the solid state based variable capacitor to control a capacitance value of the solid state based variable capacitor.

* * * * *